United States Patent [19]

Fukuda et al.

[11] 4,347,436
[45] Aug. 31, 1982

[54] PHOTOELECTRIC TRANSDUCING ELEMENT WITH HIGH POLYMER SUBSTRATE

[75] Inventors: Tadaji Fukuda; Masao Sugata, both of Kawasaki; Takashi Nakagiri, Tokyo; Masaki Konishi, Yokohama, all of Japan

[73] Assignee: Canon Kabushiki Kaisha, Tokyo, Japan

[21] Appl. No.: 134,150

[22] Filed: Mar. 25, 1980

[30] Foreign Application Priority Data

Mar. 26, 1979 [JP] Japan .................................. 54-35257

[51] Int. Cl.³ ............................................ H01J 40/14
[52] U.S. Cl. ................................. 250/211 R; 250/578
[58] Field of Search ................ 250/211 R, 211 J, 216, 250/239, 578; 357/29, 30, 31, 32

[56] References Cited

U.S. PATENT DOCUMENTS 3,315,111 4/1967 Jaffe et al. ..................... 250/211 J
3,449,705 6/1969 Chamberlin .................... 250/211 R
3,996,461 12/1976 Sulzbach et al. ................ 250/211 J Primary Examiner—David C. Nelms
Attorney, Agent, or Firm—Toren, McGeady & Stanger

[57] ABSTRACT

A photoelectric transducing element with a high polymer substrate, being characterized in that the element comprises a conductor layer formed on a flexible high polymer insulation film substrate and comprising at least one pair of independent conductor patterns and a photoelectric transducing layer superposed on the patterned portion of the conductor layer and consisting of a thin film of amorphous photoconductive material formed by means of a thin film forming means.

5 Claims, 9 Drawing Figures (a)

(b)

PHOTOELECTRIC TRANSDUCING ELEMENT WITH HIGH POLYMER SUBSTRATE

BACKGROUND OF THE INVENTION

1. Field of the Invention

The present invention relates to a photoelectric transducing element to be used in the optical instruments, the electronics and so on, particularly with excellent transducing properties and an efficient space utilization when built in an instrument.

2. Description of the Prior Art

Quite recently, instruments in which the electronic circuit is built in are becoming more and more compact, while the packing density of the parts constituting such instruments are becoming larger and larger. This imposes restrictions on intermediary cables connecting these parts to each other which restrictions require that the cables should be lighter and more dense. Further, in order to raise the utilization efficiency of the space in the instruments, it is requested that the intermediary cables should be rich in flexibility, heat-resistive and could easily be connected to other parts.

In order to meet the above conditions, quite recently the intermediary cables (polyimide flexible wire) are constructed so that, on the polyimide film substrate, a conductor layer is patterned and further a polyimide film is provided on the conductor layer. Such polyimide flexible wire, which is excellent in flexibility and space utilization efficiency, is remarkably convenient for connecting the parts in a compact instrument to each other, whereby, however, if it is used too much, there exists a danger that the stray capacity of the wire will be increased or the electrical wire could easily be picked up from outside. Namely, the increase of the stray capacity of wire causes the response delay of the electrical circuit or decrease of the S/N ratio. This will often cause misoperations, which is undesirable. In order to eliminate such undesirable phenomena, the parts are integrated so as to cut the intermediary cables short, while the transmission parts of the low level signal as well as the connections of the high impedance circuitry are made as few as possible. However, the integration of the parts is limited technically and economically and it is difficult to integrate all the parts into a miniature type.

For example, the space itself in which the photoelectric transducing element of the light measuring part in the electronic circuit for controlling the exposure amount of the camera is contained has a limit and the photoelectric transducing element and the exposure control circuit parts should often be contained in separate spaces. Namely, the photoelectric transducing element and the electric circuit are contained in the spaces distant from each other, whereby the connection between them should be made by means of flexible intermediary cables.

It is necessary that the photoelectric transducing element to be used for the camera and so on should excel in sensitivity and weather resistance, cover the whole range of visible light and be quick in response. In order to meet such conditions, normally ceramic CdS and crystal silicon (hereinafter called C-Si) are used.

The photoelectric transducing portion of the photoelectric transducing element consisting of such materials is contained in a package, whose lead terminal is connected to the one end of the conductor of the flexible intermediary cable by heat press, soldering, ultrasonic bonding or the like, while the other end of the flexible cable is connected to the electronic circuit. If it is possible to form the photoelectric transducing element itself in a thin film, the element and the intermediary cable can be formed in one body on one member and in one plane, so that the bonding process between the above element and the cable is not necessary to simplify the manufacturing process. Accordingly, not only is the element itself light and thin so as to economize the space but also the misoperation is eliminated and, further, the properties are much improved. The thin film for constituting such photoelectric transducing element is normally formed by means of the vacuum metallization method, whereby Se, CdS and so on as materials for the photoelectric transducing material which can be manufactured by means of the metallization method cannot present the sensitivity, the weather resistance, the stability, the spectroscopic sensitivity and the light response satisfactorily by means of the conventional thin film forming method. Therefore, actually no construction of this formation has been brought into practice.

SUMMARY OF THE INVENTION

The purpose of the present invention is to overcome the above-mentioned difficulties. Hereby, as a photoelectric transducing element, the hydrogenated amorphous silicon thin film (hereinafter called a-Si:H) formed by means of the thin film forming techniques such as the glow discharge method, the sputtering method, the ion plating method and so on is made use of. Hereby, the sensitivity, the spectroscopic characteristics and the weather resistance of the above thin film is equal or even superior to those of the solid photoelectric transducing elements now in practice, while the optical condition for forming the thin film is lower than the endurable temperature of the high polymer sheet, such as polyimide. Namely, the high polymer fiber can be made use of as the base of the element and in this context, the thin film photoelectric transducing element is manufactured.

At first object of the present invention is to offer an electronic active part with small stray capacity and small noise, by forming the electronic active part itself on a flexible high polymer film as base, whereby the film itself is made use of as flexible wire so as the to eliminate the provision of the intermediary cable in order to simplify the electronic circuit.

A second object of the present invention is to offer a photoelectric transducing element so designed that a photoconductive member excellent in flexibility, avoidance of public contamination, sensitivity, weather resistance, wear resistance, non-solubility and so on is provided on a flexible high polymer film.

A third object of the present invention is to offer a photoelectric transducing element so designed that a photoconductive member having a high image resolution ability and capable of producing an electrical signal in accordance with the intensity of the light signal is provided on a flexible high polymer film.

A fourth object of the present invention is to offer a photoelectric transducing element so designed that a photoconductive member, whose spectroscopic sensitivity covers the whole range of visible light and whose light response is quick, is provided on a flexible high polymer film.

DESCRIPTION OF PREFERRED EMBODIMENTS

Below, the present invention will be explained in detail in accordance with the drawings of the embodiments.

Figure 1:
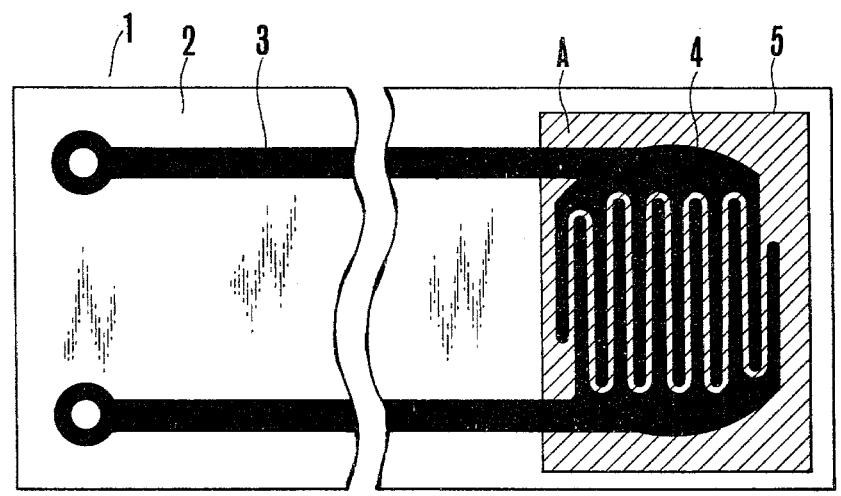
FIG. 1 shows a plane view of an embodiment of the photoelectrical transducing element consisting of the high polymer film substrate in accordance with the present invention.
Figure 2:
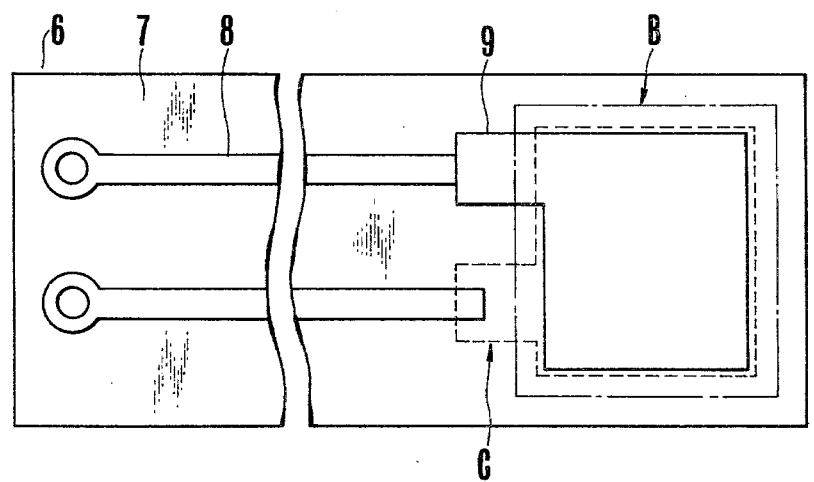
FIGS. 2, 3 and 4 show plane views of other embodiments in accordance with the present invention.

FIGS. 1 and 2 show one of the most representative high polymer film substrate for constituting a photoelectric transducing element in accordance with the present invention. The high polymer film substrate 1 shown in FIG. 1 has the high polymer film support 2, the heat fixed copper electrode layer 3 and the comb tooth-shaped electrode layer 4 is mask metallized on the copper electrode layer 3.

In the domain A in the oblique lines on the above substrate, a photoconductive layer consisting of a-Si:H is mask metallized. As high polymer film support, polyimide high polymer film is generally used. On a part or the whole of the surface of the polyimide high polymer film support, the copper electrode layer is laminated, whereby it is desired that the copper electrode layers are patterned at a certain interval from each other in such a manner that each or a plural number of the layers is independent from each other.

For the shape of the high polymer film support, a circle, a polygon, a window shape or any other optical shapes can be selected in accordance with the particular need.

The thickness of the support can be accordingly selected so as to obtain a desired flexibility strength.

The material for forming the electrode layer 4 to be brought into direct contact with the photoconductive layer of a-Si is as follows: H is selected in accordance with the particular equipment that the interface electrical properties should be ohmic resistance or the rectifying ability, the material should constitute an alloy with the photoconductive material a-Si:H or the electrode material should be dispersed into the photoconductive material of a-Si:H.

The electrode forming materials for making an ohmic contact with the photoconductive layer a-Si are as follows: H are Nb, Ta, V, Ti, Cr, Mo, Al and so on, while those for making a rectifying contact are Au, Ir, Pt, Rh, Pd and so on. The photoconductive layer 4 is formed on the support 2 by means of the glow discharge method, the sputtering method or the ion implantation method and so on. From the above methods, a suitable one is selected in accordance with the manufacturing conditions, the investment for the installation, the manufacturing scale, the properties required of the photoelectric transducing element to be manufactured, whereby the glow discharge method is most preferred, having various merits such that the control for the manufacture of the photoelectric transducing elements having desired properties can be carried out comparatively easily, such that the impurity of II family or V family can easily be introduced into the a-Si layer by replacement so as to control the properties. Further, in accordance with the present invention it is remarkably effective to form the a-Si layer by adopting both of the glow discharge method and the sputtering method.

The photoconductive layer 4 of a-Si is controlled by doping for example H in order that the electrical properties should correspond to the value required of the photoconductive layer of the photoelectrical transducing element. H can be doped into the photoconductive layer 4 of a-Si in such a manner that at the time of forming the photoconductive layer 4, the compounds in form of $SiH_4$, $Si_2H_6$ or $H_2$ are introduced into the installation, and then resolve by means of heat or the glow discharge so as to dope H into the a-Si layer or by means of the ion implantation method.

To the best of the knowledge of the present inventors, it is obvious that the amount of H to be doped into the a-Si photoconductive layer 4 is one of the most remarkably important factors for deciding whether the formed a-Si layer can be made use of as the photoconductive layer of the photoelectric transducing element.

In accordance with the present invention, it is desirable that the amount of H to be doped into the a-Si layer should normally be 1–40 atomic %, most preferably 2–30 atomic %, in order that the formed a-Si layer might be made sufficient use of as photoconductive layer of the photoelectrical transducing element. The reason why the amount of H to be doped into the a-Si layer is limited within the range of the above numerical figures has not yet been theoretically clarified but only presumed. However, from a number of the test results it is endorsed that it is a necessary condition that the amount of H to be doped should be within the range of the above numerical figures, whereby it is acknowledged that if the amount of H doped does not lie within the range of the above numerical figures, the photosensitivity of the photoconductive layer of the photoelectrical transducing element is remarkably low or at times zero, the movable current carries due to the light exposure are scarcely increased and so on. H is doped into the a-Si layer in case the a-Si layer is formed by means of the glow discharge method in accordance with which the hydride such as $SiH_4$, $Si_2H_6$ and so on is used as a starting material for forming the a-Si layer, being decomposed. Hereby, in order to dope H into the layer in a more efficient way, it is sufficient to introduce $H_2$ gas into the system in which the glow discharge is carried out.

In the case of the spattering method, it is sufficient to introduce $H_2$ gas, or the silicon hydride gas such as $SiH_4$, $Si_2H_6$ and so on or other gas such as $B_2H_6$, $PH_3$ and so on for doping impurities if the spattering is carried out against Si as a target in the atmosphere of inert gas such as Ar and so on.

In order to control the amount of H to be doped into the a-Si layer, it is sufficient to control the temperature of the substrate to be metallized or the amount of the start material used for doping H into the installation. Further, it is recommended that the formed a-Si layer be exposed to the activated hydrogen atmosphere. Further, it is also recommended that the a-Si layer be heated under a temperature lower than the crystallization temperature.

The a-Si layer can be made intrinsic by doping impurities at the time of manufacture, while the conduction type can be controlled, so that the construction of the photoconductive layer of the photoelectrical transducing element can optionally be selected to be single layer type having one conductive type or a double or a triple layer type such as PN, PIN junction type having different conduction types, which is very advantageous, because the operation of the photoconductive element can easily be selected between the photoconductive type and the photovoltaic type.

For the impurities to be doped into the a-Si layer, the elements of IIIA in the periodic table such as B, Al, Ga, In, Tl and so on are recommended in order to make the type of the a-Si layer P and the elements of VA in the periodic table such as N, P, As, Sb, Bi and so on in order to make the type of the a-Si layer n. The amount of the impurities to be contained in the a-Si layer is ppm order, so that it is not necessary to pay special attention to the public contamination as compared with the substantial matter constituting the photoconductive layer, whereby it is, however, recommendable to use an element with the smallest public contamination. From the above, for example, B, As, P, Sb and so on can be said to be most recommendable from the view point of the electrical and the optical properties of the a-Si photoconductive layer to be formed.

The amount of the impurities to be doped into the a-Si layer is properly decided in accordance with the electrical and optical properties required, whereby in case the impurities are IIIA of the periodical table, normally $10^{-6}$–$10^{-3}$ atomic % is recommended, whereby $10^{-5}$–$10^{-4}$ atomic % most preferable, while if they are VA of the periodical table, normally $10^{-3}$–$10^{-5}$ atomic % is recommended, whereby $10^{-8}$–$10^{-7}$ atomic % is most preferable.

The doping method of the impurities into the a-Si layer is different in accordance with the forming method of the a-Si layer. Below, the method will be concretely explained in detail in accordance with the embodiments.

The thickness of the a-Si:H layer is to be decided in accordance with the properties of the photoelectric transducing element and the required utilization conditions such as high flexibility, the resistance and the capacity of the elements and so on, whereby in the normal case 0.2–10 μm is recommended, 0.5–5 μm preferable and 0.8–3 μm most preferable.

If the photoelectric transducing element whose a-Si photoconductive layer surface is exposed as is shown in FIG. 1, the refractive index of the a-Si film is as large as about 3.35 so that the light is apt to be reflected on the photoconductive layer surface, when exposed to the light, as compared with the conventional photoconductive layer, whereby the amount of the light absorbed in the photoconductive layer surface is decreased in such a manner that the ratio of the light loss is increased. In order to lower as much light loss as possible it is recommended that the antireflection layer be provided on the a-Si photoconductive layer. This antireflection layer serves at the same time as the protection layer of the photoconductive layer.

For the material for the antireflection layer, the condition that it does not give an inferior influence on the a-Si light conductive layer, being excellent in the antireflection ability should be fulfilled.

In order to obtain an effective antireflection ability, as can be understood from a simple optical geometry, it is sufficient to select the material for the antireflection layer in such a manner that the refractive index of the material is between that of the a-Si layer and that of the air. Further, it is preferable that the thickness of the layer is λ/4 n or λ/4 n multiplied with an integer, whereby λ/4 n is most preferable when the light absorption in the antireflection layer itself is taken into consideration. (Hereby, n is the refractive index of the a-Si layer, while λ the wavelength of the exposure light.)

Taking the above optical conditions into consideration, it is most preferable that the thickness of the antireflection layer is 25–60 μm, supposing that the wavelength of the exposure light is almost in the range of the wavelength of the visible light.

The materials for the effective antiflection layer in accordance with the present invention are the inorganic fluorides or the inorganic oxides such as $MgF_2$, $Al_2O_3$, $ZrO_2$, $TiO_2$, $ZnS$, $CeO_2$, $SiO_2$, $SiO$, $Ta_2O_5$, $AlF_3$, $3NaF$ and so on, or the organic compounds such as polyparaxylane, PVC, polyamide resin, vinylidane fluoride, melamine resin, epoxy resin, phenol resin, cellulose acetate and so on.

On the high polymer film substrate 6 constituting the photoelectric transducing element shown in FIG. 2, the laminated copper electrode layer 8 and the under electrode layer 9 which is partially superposed on the copper electrode layer and on which the a-Si:H photoconductive layer is laminated are mask metallized.

On the range B shown in a dot dash line on the substrate, a photoconductive layer consisting of a-Si:H is mask metallized, while further on, the range C shown in a dotted line, a permeable or a half-permeable over electrode layer is mask metallized so as to constitute a superposed construction on the copper electrode layer. The material for the under electrode layer can be the same as that for the above electrode layer 4.

It is necessary that the over electrode layer on whose C range the light is incident should have a high electrical conductivity and a high light permeability. Thus, the material for the over electrode layer is to be selected from Au, Al, NiCr, Pd, $In_2O_3/SnO_2$, CuI, $TiO_x/Ag/TiO_x$ and so on.

Figure 3:
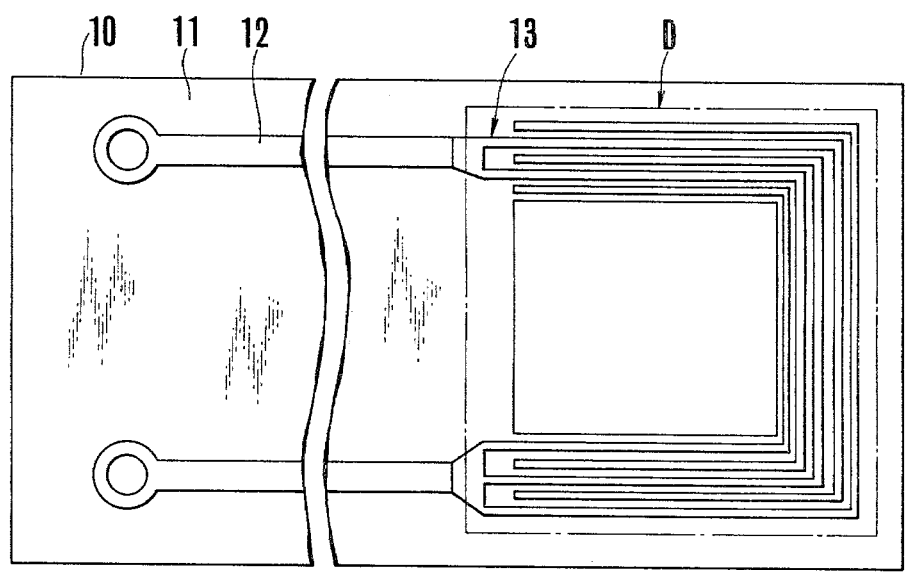

The high polymer film substrate 10 forming the photoelectrical transducing element shown in FIG. 3 is partially cut off in a square shape and on the copper electrode layer laminated on the remaining space a comb tooth shaped electrode layer which is partially superposed on the copper electrode layer on which the a-Si:H photoconductive layer is laminated is mask metalized. In the range D shown in a dotted line on the above substrate, the a-Si:H photoconductive layer is mask metalized. The material for the above comb tooth shaped electrode layer 13 can be the same as that for the above electrode layer 4.

Figure 4:
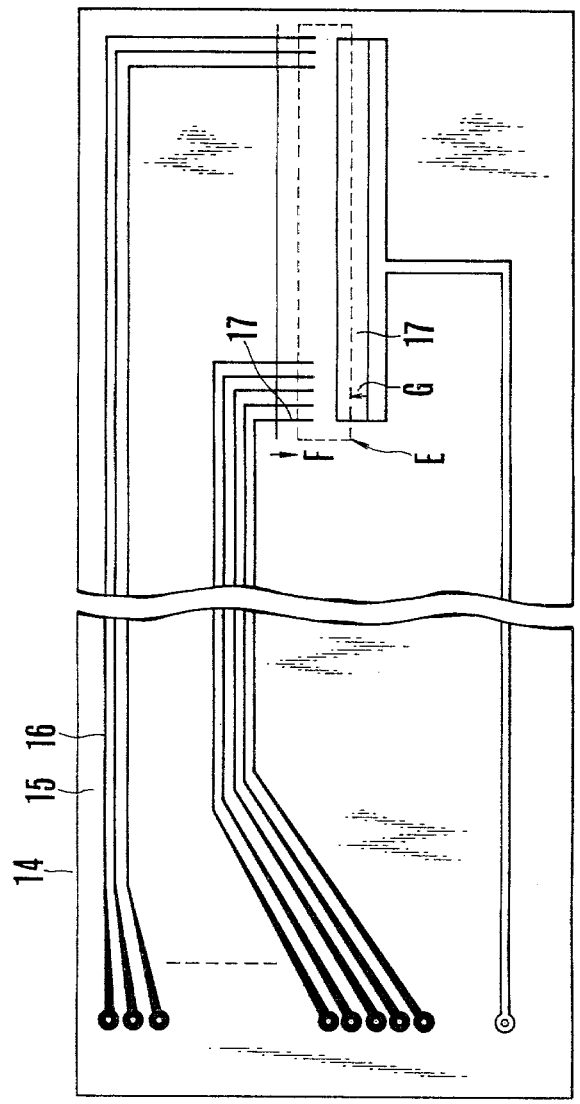

In the case of the high polymer film substrate 15 forming the photoelectric transducing element shown in FIG. 4, the end of the copper electrode layer laminated on the high polymer film substrate is divided into several ten to several thousand stripes with 250–83μ, pitch, whereby each stripe is independent of others. Hereby, a part (from F up to the ends in the drawing) is covered with other metal by means of the mask metalization or the auto-etching. Further, in accordance with necessity, at the position distant from the ends of F by 250–83μ the counter-copper electrode layer laminated on the high polymer film substrate is provided, whereby a part of the layer (From G upto the ends in the drawing.) is covered with other metal by means of the mask metalization or the photo-etching. The material for the metal for covering the above laminated copper electrode layer can be the same as that for the above electrode layer 4. On the domain E shown in a dotted line on the substrate, the a-Si:H photoconductive layer is mask metalized.

Below, the manufacture of the photoconductive layer of the photoelectric transducing element in accordance with the present invention by means of the glow discharge method and the spattering method will be explained in detail.

Figure 5:
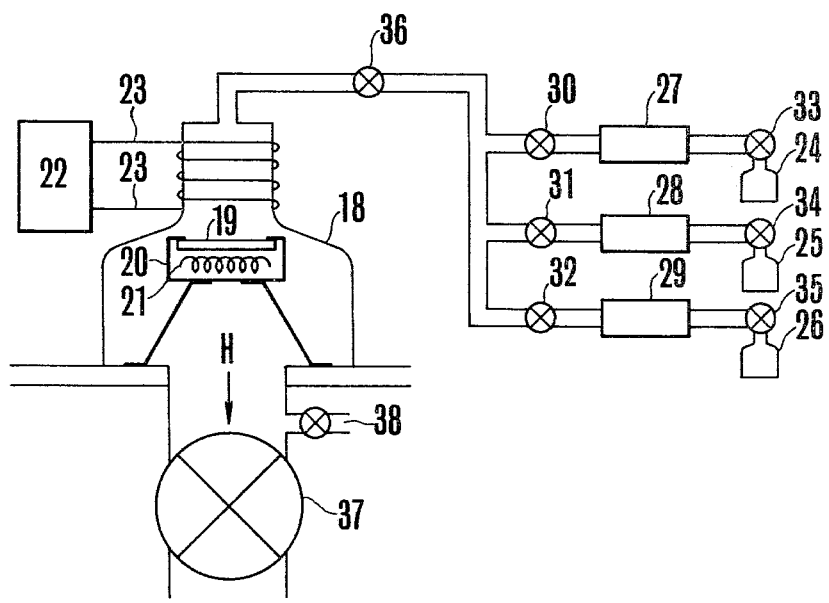
FIG. 5 shows a sketch of a photoconductive layer manufacturing equipment for the photoelectric transducing element in accordance with the present invention by means of the glow discharge method.

FIG. 5 shows a sketch of the glow discharge equipment for manufacturing the photoconductive layer of the photoelectric transducing element in accordance with the present invention by means of the glow discharge method.

18 is the glow discharge chamber, in which a polyamide film substrate on which the a-Si:H photoconductive layer is to be formed is secured on the fixing member 20, while, under the substrate 19, a heater 21 for heating the substrate 19 is provided. On the upper part of the chamber 18, a capacitive type electrode 23 connected to the high frequency generator 22 is provided in such a manner that when the high frequency generator 22 is switched on, a high frequency current is applied to the electrode 23 so as to produce a glow discharge in the chamber 18.

To the upper end of the chamber 18, the gas introducing pipe is connected in such a manner that the gas is introduced into the chamber 18 from the bombs 24, 25 and 26 in accordance with necessity. 27, 28 and 29 are the flow meters for detecting the quantity of the flowing gas. Further, 30, 31 and 32 are the needle valves, 33, 34 and 35 the flow quantity adjusting valves and 36 the auxiliary valve.

The lower end of the chamber 18 is connected to the vacuum pump (not shown in the drawing) through the main valve 37. 38 is the valve for breaking the vacuum in the chamber 18.

In order to form the a-Si:H photoconductive layer with the desired characteristics on the substrate 19 by making use of the glow discharge equipment shown in FIG. 5, the substrate 19 is at first submitted to the cleaning process and secured on the fixing member 20 in such a manner that the cleaned surface comes upwards.

In order to clean the surface of the substrate 19, an ordinary chemical process by means of for example alkali or acid is applied. Further, the substrate cleaned to some extent is put in the chamber 18 and glow discharged before forming the a-Si:H photoconductive layer on it. In this case, the process from the cleaning process of the substrate 19 up to the formation of the a-Si:H can be carried out in one system, so that any deposition of impurities on the cleaned surface of the substrate can be avoided. When the substrate 19 is secured on the fixing member 20, the main valve 37 is totally opened so as to exhaust the air in the chamber 18 and establish a vacuum of about $10^{-5}$ torr. After a certain determined vacuum has been established in the chamber 18, the heater 21 is operated so as to heat the substrate 19 until the temperature of the substrate 19 has reached a certain determined value, when the temperature is kept constant.

Then, the auxiliary valve 36 is totally opened, and then the needle valves 30 and 31 for the gas bombs 24 and 25 respectively are totally opened. The bomb 24 is for Ar gas, while 25 is for the material for forming the A-Si layer, containing $SiH_4$, $Si_2H_6$, $Si_4H_{10}$ or their mixture. Further, the bomb 26 is for the material for producing impurities to be introduced into the a-Si:H photoconductive layer in accordance with necessity, containing $PH_3$, $P_2H_4$, $B_2H_6$ and so on.

Then, the flow quantity adjusting valves 33 and 34 for the bombs 24 and 25 respectively are gradually opened, while looking at the flow meters 27 and 28 so as to introduce Ar gas and, for example, $SiH_4$ gas into the chamber 18. At this time, Ar gas is not always necessary and only $SiH_4$ can be introduced. When Ar gas and $SiH_4$ gas are introduced, the ratio of the quantity of $SiH_4$ gas to that of Ar gas is decided as is required, whereby normally the ratio is more than 10 Vol. %. Further, Ar gas can be replaced with He gas.

At the time point at which the gas is introduced into the chamber 18 from the bombs 24 and 25, the main valve 37 is adjusted so as to the determined vacuum, normally the pressure of the raw material gas for forming the a-Si:H layer at $10^{-2-8}$ torr. Then, to the capacitive type electrode 28 provided outside of the chamber 18 a high frequency current with normally 0.2–30 MHz is supplied from the high frequency generator 22 so as to produce a glow discharge in the chamber 18, whereby for example $SiH_4$ gas is decomposed in such a manner Si is metalized on the substrate 19 so as to form the a-Si:H layer.

In order to introduce impurities into the a-Si:H photoconductive layer to be formed, it is sufficient to introduce the gas for producing impurities from the bomb 26 into the chamber 18 at the time of forming the a-Si photoconductive layer. In this case, by properly adjusting the flow quantity adjusting valve 35 the amount of the gas to be introduced from the bomb 26 into the chamber 18 can properly adjusted, so that the amount of the impurities to be introduced into the a-Si photoconductive layer can optionally controlled. Besides the above, it is easily possible to vary the amount of the impurities along the direction of the thickness of the a-Si photoconductive layer.

Although the RF (Radio Frequency) coil type glow discharge method is applied in the glow discharge equipment shown in FIG. 5, other glow discharge methods such as of RF two electrode type, the DC two electrode type and so on can also be applied. Further, the electrode for the glow discharge can be provided either outside or inside of the chamber 18.

In order to obtain an effective glow discharge in accordance with the present invention, an AC or a DC with the current density of 0.1–10 mA/cm$^2$ is recommended to be adjusted at 300–5000 V.

The properties of the a-Si photoconductive layer to be formed depends much on the temperature of the substrate during the formation so that it is recommended to control the temperature in a strict way. In accordance with the present invention, by choosing the temperature of the substrate to be normally 50°–350° C. and preferably 100°–250° C., the a-Si photoconductive layer having an effective property as photoconductive layer of the photoelectric transducing element can be formed. Further, the forming speed of the a-Si:H layer influences greatly the properties of the layer, whereby in order to realize the purpose of the present invention normally 0.3–50 Å/second, preferably 0.5–30 Å/second is recommended.

Below, the application of the photoelectric transducing element in accordance with the present invention to the light measuring device for the camera will be explained in detail.

Figure 6:
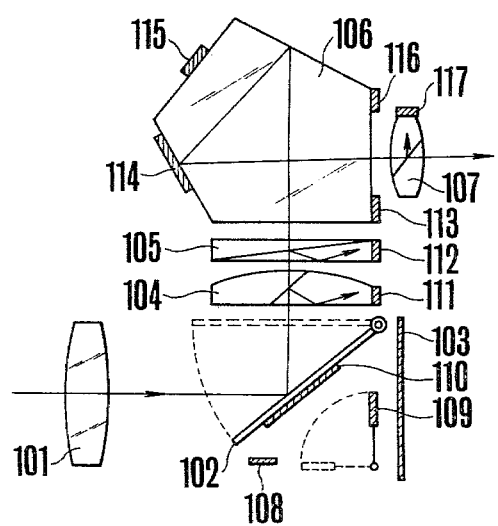
FIG. 6 shows a sketch for showing the positions at which the photoelectrical transducing elements in accordance with the present invention are used as a light sensing element for a single lens reflex camera.

FIG. 6 shows a sketch of a single lens reflex camera for showing the positions at which the photoelectric transducing elements in accordance with the present invention can be arranged as light sensing elements. In the drawing, 101 is the photographing lens, 102 the movable mirror, 103 the image plane (film plane), 104 the focusing plate and the condenser lens, 105 the half permeable mirror, 106 the pentagonal prism, and 107 the eye piece. They are the members for consituting the optical system of the conventional single lens reflex camera. 108 to 117 respectively show a position at which a light sensing element can be arranged. The photoelectric transducing elements which have been used as light sensing elements until now are the solid elements consisting of CdS, C-Si and so on contained in package of aluminum oxide, plastics and so on, so that a certain space in the camera is needed for arranging them. Further, intermediary cables are used for the electrical connection to the circuit substrate, for which a certain space is also needed. In accordance with the present invention, by forming the a-Si:H layer as a photoelectric transducing element on the flexible printed circuit substrate, the electrical connection between the light sensing element and the circuit substrate can be eliminated, while the space occupied with the light sensing part can be minimized so that the light sensing part can be arranged optionally at the positions 108–117 in the camera, as is shown in FIG. 6.

Figure 7:
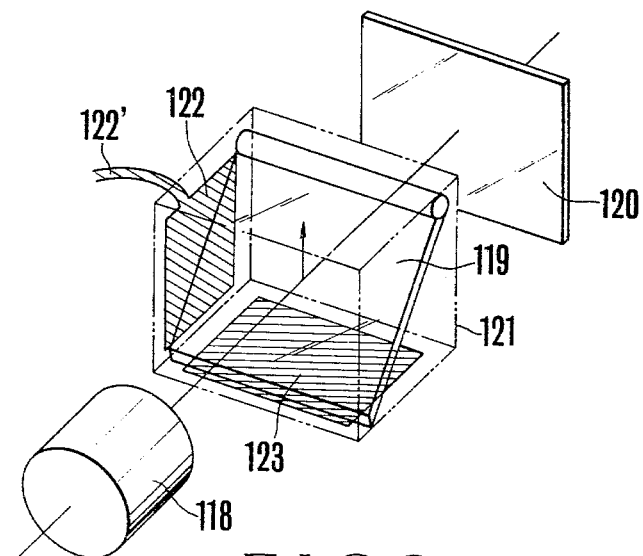
FIG. 7 shows a sketch for showing the positions at which the photoelectrical transducing elements in accordance with the present invention are used so as to confirm the exposure of the single lens reflex camera.

FIG. 7 shows a sketch for showing another application of the photoelectric transducing element in accordance with the present invention, for monitoring in order to confirm whether the image plane is properly exposed. The confirming method is divided into two, namely the one in accordance with which the light reflected from the image plane is measured and the other in accordance with which the light coming through the image plane is measured. Shown in the drawing is the method in accordance with which the light reflected from the image plane is measured, whereby 118 is the photographing lens, 119 the mirror, 120 the image plane, 121 the mirror box for supporting the mirror and 122 and 123 the flexible circuit substrates having the light sensing element. The a-Si:H photoelectric transducing element in accordance with the present invention can be formed remarkably thin and, therefore, can be arranged on the bottom plane (23) or at the side plane (22), as is shown in the drawing, without enlarging the inside of the mirror box. Further, 122' in the drawing shows that the electrical connection means to the control part can be formed as one body with the substrate.

Figure 8:
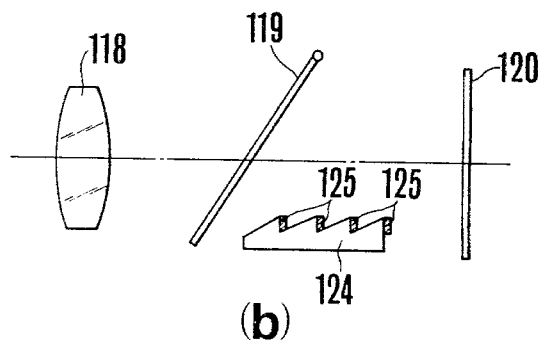
FIGS. 8a and 8b respectively show a side view of an embodiment of the construction when the photoelectric transducing element in accordance with the present invention is used as light sensing element for sensing the light reflected from the image plane.
Figure 8:
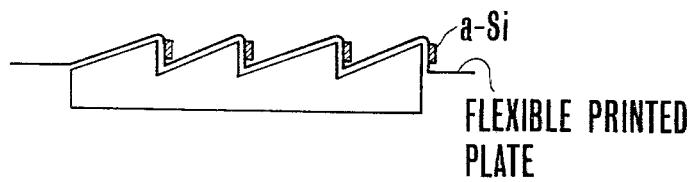

FIG. 8 shows a sketch of another embodiment in accordance with which the light reflected from the image plane is measured as in the case shown in FIG. 7, whereby on the bottom plane of the mirror box the a-Si:H member with saw tooth shaped profile as is shown in FIG. 8(a) is arranged so as to measure only the light reflected from the image plane by arranging the light measuring elements on whose planes facing to the image plane. Hereby, the photoelectric transducing element in accordance with the present invention can have complicated planes and be arranged along the saw tooth shaped substrate in the mirror box, whereby the a-Si:H light sensing elements are arranged only on the planes facing to the image plane as is shown in FIG. 8(b).

In order to measure the light coming through the film, it is sufficient to arrange the light sensing element immediately behind the image plane, whereby in most cases the element is arranged on a part of the pressure plate of the light sensitive film on the image plane. In this way, a sufficiently large area of the light sensing range can be obtained so as to realize a sufficient photoelectric conversion despite of a small attenuation of the light amount in the film.

As has so far been explained in detail, the photoelectric transducing element in accordance with the present invention can be formed remarkably thin so that by forming the element immediately on the flexible substrate the circuit construction can be realized as one body without using the intermediary cable, while the photoelectric transducing element itself is also flexible it is possible to form the element on the curved plane. Besides the above features, the element is excellent in sensitivity, weather resistance, stability, light sensitivity, light response and so on. Accordingly, the element is, quite suited for constituting the light sensing part particularly of a compact camera and has a wide range of application, which is remarkably advantageous for manufacturing instruments.

What is claimed is:

1. In a photoelectric transducing element formed on a flexible high polymer insulating film substrate, the improvement comprising:
   a conductor layer which is printed on one surface of said high polymer insulating film substrate and comprising at least a pair of independent conductor patterns; and
   a photoelectric transducing layer comprising amorphous photoconductive thin film formed by a thin film forming means with a portion thereof being superimposed on the patterned portion of said conductor layer and the remaining portion thereof contacting the plane of the high polymer insulating film substrate.

2. In a photoelectric transducing element formed on a flexible high polymer insulating film substrate, the improvement comprising:
   a first conductor layer pattern being printed on one of the surfaces of the high polymer insulating film substrate, said first conductor layer having a patterned plane;
   a photoelectric transducing layer being superimposed on said patterned plane of said first conductor layer and comprising an amorphous photoconductive thin film formed by a thin film forming means; and
   a second conductor layer pattern having a patterned part being superimposed on the pattern of the first conductor layer and comprising an electrically conductive layer of light transmitting nature formed over said photoelectric transducing layer.

3. A photoelectric transducing element with a high polymer film used as a substrate according to claim 1 or 2, wherein a light incident planar surface of the photoelectric transducing element is processed so as to be virtually non-reflective to incident light making it a non-reflective planar surface.

4. A photoelectric transducing element with a high polymer film used as a substrate according to claim 1 or 2, wherein the flexible high polymer insulating film substrate can have an electric circuit structure other than the photoelectric transducing element mounted on the surface other than the surface at which the photoelectric transducing element is formed.

5. A photoelectric transducing element with a high polymer film used as a substrate according to claim 1 or 2, wherein the high polymer insulating film substrate having said photoelectric transducing element is adapted to form a bent plane along a housing plane of a piece of equipment when housed in the equipment.

* * * * *